(12) United States Patent
Katata et al.

(10) Patent No.: US 6,566,632 B1
(45) Date of Patent: May 20, 2003

(54) HOT PLATE AND SEMICONDUCTOR DEVICE MANUFACTURING METHOD USING THE SAME

(75) Inventors: Tomio Katata, Yokohama (JP); Nobuo Hayasaka, Yokosuka (JP); Katsuya Okumura, Chiba (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/503,723

(22) Filed: Feb. 15, 2000

(30) Foreign Application Priority Data

Feb. 16, 1999 (JP) ............................. 11-037729

(51) Int. Cl.[7] ................................................ H05B 3/68
(52) U.S. Cl. ...................................... 219/444.1; 425/16
(58) Field of Search ........................... 219/444.1, 446.1, 219/391, 388, 468.1, 544, 457.1; 62/3.3; 427/240; 438/655, 687; 347/14; 425/116

(56) References Cited

U.S. PATENT DOCUMENTS

| | | | | |
|---|---|---|---|---|
| 4,556,785 A | * | 12/1985 | Blechschmid et al. ... | 219/444.1 |
| 5,025,133 A | * | 6/1991 | Tsutahara et al. ........ | 219/444.1 |
| 5,059,770 A | * | 10/1991 | Mahawili ..................... | 219/391 |
| 5,210,485 A | * | 5/1993 | Krieger et al. ............ | 324/158 P |
| 5,415,535 A | * | 5/1995 | Sato et al. .................. | 425/116 |
| 5,573,690 A | * | 11/1996 | Nobori et al. ............ | 219/457.1 |
| 5,580,607 A | * | 12/1996 | Takekuma et al. .......... | 427/240 |
| 5,626,782 A | * | 5/1997 | Maeda ..................... | 219/444.1 |
| 5,702,624 A | * | 12/1997 | Liao et al. ................ | 219/444.1 |
| 5,834,739 A | * | 11/1998 | Lockwood et al. ...... | 219/468.1 |
| 5,835,334 A | | 11/1998 | McMillin et al. ........... | 361/234 |
| 5,927,077 A | * | 7/1999 | Hisai et al. ................... | 62/3.3 |
| 6,002,108 A | * | 12/1999 | Yoshioka ..................... | 219/388 |
| 6,046,439 A | * | 4/2000 | Johnsgard et al. ....... | 219/444.1 |
| 6,048,791 A | * | 4/2000 | Katata et al. .............. | 438/655 |
| 6,100,506 A | * | 8/2000 | Colelli et al. ............ | 219/446.1 |
| 6,107,609 A | * | 8/2000 | Strodtbeck et al. ...... | 219/446.1 |
| 6,111,744 A | * | 8/2000 | Doan .......................... | 361/311 |
| 6,140,236 A | * | 10/2000 | Restaino et al. ............ | 438/687 |
| 6,147,334 A | * | 11/2000 | Hannigan ................... | 219/544 |
| 6,204,489 B1 | * | 3/2001 | Katsuda et al. ............. | 219/544 |
| 6,234,599 B1 | * | 5/2001 | Ishinaga et al. .............. | 347/14 |

FOREIGN PATENT DOCUMENTS

JP 11-111829 4/1999

* cited by examiner

Primary Examiner—Teresa Walberg
Assistant Examiner—Leonid M Fastovsky
(74) Attorney, Agent, or Firm—Finnegan, Henderson, Farabow, Garrett & Dunner, L.L.P.

(57) ABSTRACT

An electrostatic chuck type of hot plate is disclosed which permits the temperature of a semiconductor substrate to be measured with good repeatability. In addition to an electrostatic chuck electrode and a heating electrode as provided in conventional hot plates, the inventive hot plate is further provided with two or more temperature measuring probes.

18 Claims, 4 Drawing Sheets

HOT PLATE AND SEMICONDUCTOR DEVICE MANUFACTURING METHOD USING THE SAME

CROSS-REFERENCE TO RELATED APPLICATION

This application is based upon and claims the benefit of priority from the prior Japanese Patent Application No. 11-037729, filed Feb. 16, 1999; the entire contents of which are incorporated herein by reference.

BACKGROUND OF THE INVENTION

Conventionally, the semiconductor process involves the process of depositing an insulating film or conducting film over a semiconductor substrate and the process of patterning the insulating or conducting film through etching, those processes being performed repeatedly to form a semiconductor circuit.

The deposition and etching of a film utilize chemical or physical reactions; thus, the deposition and etch rates depend on the temperature of a semiconductor substrate (substrate temperature). The quality of the deposited film also varies with the substrate temperature. Therefore, in order to perform film deposition and etching with good repeatability, it is essential to control the substrate temperature during deposition and etching.

Conventionally, a semiconductor substrate is often heated by irradiating it with infrared radiation from its top or back. In many cases, films have been formed in advance over the semiconductor substrate to be heated. The efficiency of absorbing infrared radiation varies with the types of films.

For this reason, the semiconductor substrate heating method using an infrared lamp suffers from a problem that it is impossible to control the substrate temperature accurately because the infrared radiation absorbing efficiency varies with the types of films. The method has another problem that the substrate temperature elevates greatly during infrared ray irradiation because the semiconductor substrate can not be cooled during that time.

Recently, a method has been often used by which a hot plate having a resistance heating element incorporated is fixed to a stage equipped with a cooling means, a semiconductor substrate placed on the hot plate is heated by the heating element, and the semiconductor substrate is cooled by means of the cooling means so that the substrate temperature may not rise greatly.

There are some methods of fixing a semiconductor substrate to the hot plate: exhausting the hot plate from its back, using electrostatic absorption, etc. However, the back exhausting method has a problem of its inability to be used in a vacuum.

In contrast, the electrostatic absorption method has come into frequent use in recent years because the semiconductor substrate can be fixed to the hot plate with no contact with its surface into which the device is manufactured and use can be made even in a vacuum.

With the hot plate using such an electrostatic chuck, the substrate temperature is measured by inserting a thermocouple 81 into a hole formed in the back of a hot plate 80 and measuring an electromotive force developed by the thermocouple as shown in FIG. 6. In this figure, 82 denotes an electrostatic chuck electrode and 83 denotes a heating electrode.

BRIEF SUMMARY OF THE INVENTION

It is an object of the present invention to provide a hot plate which permits the substrate temperature to be measured with good repeatability.

It is another object of the present invention to provide a method of manufacturing a semiconductor device which permits the prevention of variations in processing of the semiconductor substrate due to variations in measured temperatures of the hot plate.

A hot plate of the present invention is characterized by comprising: a plate body on which a semiconductor substrate is placed; an heating electrode formed within the plate body; and at least one temperature measuring probe formed within the plate body.

A method of manufacturing a semiconductor device of the present invention is characterized by comprising the steps of: placing a semiconductor substrate on a hot plate including a plate body on which a semiconductor substrate is to be placed, a heating electrode formed within the plate body, and a temperature measuring probe formed within the plate body (in this case, it is preferable to fix the substrate to the hot plate through the use of an electrostatic chuck); and processing the semiconductor substrate while maintaining the semiconductor substrate at a predetermined temperature by controlling a voltage application unit for applying a voltage to the heating electrode and a cooling unit for cooling the hot plate on the basis of temperature measurements by the temperature measuring probe.

In the present invention, the temperature measuring probe is formed within the plate body. Because this type of temperature measuring probe can be formed with good reproducibility, the temperature of the hot plate can be measured with good repeatability by measuring the temperature of the probe.

By using the hot plate of the present invention as a hot plate, the temperature of the semiconductor substrate can be measured with good repeatability, which permits the prevention of occurrence of variations in a semiconductor substrate process such as film formation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 6:
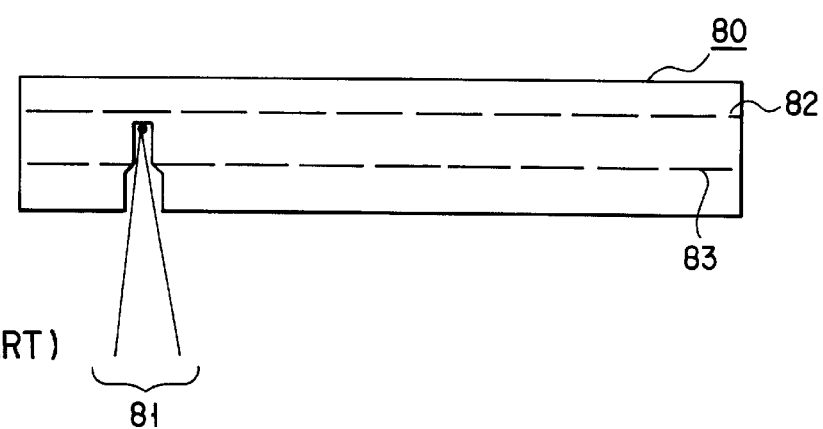
FIG. 6 is a diagram for use in explanation of a method of measuring the temperature of a conventional hot plate.

First, the problem with the conventional substrate temperature measurement method by which the present invention has been motivated will be described. In the conventional substrate temperature measurement method shown in FIG. 6, there is a problem that the repeatability of measured substrate temperatures cannot be achieved because the control of the depth of a hole into which a thermocouple is inserted and the hole position are subject to variations each time a hot plate is mounted.

One might suggest another substrate temperature measurement method by which a thermocouple is sandwiched between a hot plate and a stage when the former is mounted to the latter and an electromotive force developed by the thermocouple is measured. However in this method, there is a problem that the strength of contact of the thermocouple with the hot plate is subject to variation each time the hot plate is mounted to a stage, resulting in failure to achieve the repeatability of the substrate temperature.

With such a semiconductor substrate process for film formation or etching with a semiconductor substrate placed on a hot plate, there is a problem that the process varies over the position of a substrate or from substrate to substrate because the repeatability of the substrate temperature cannot be achieved.

The present invention has been made to solve the above-mentioned problems.

Hereinafter, the present invention will be described with reference to the accompanying drawings.

First Embodiment

Figure 1:
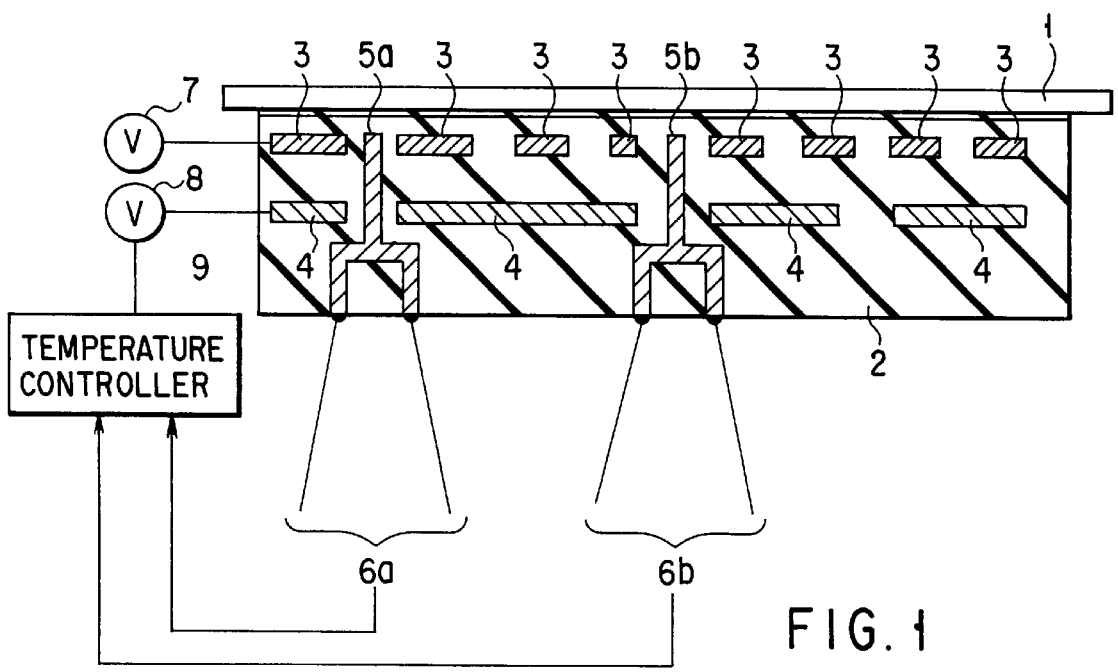
FIG. 1 is a schematic illustration of an electrostatic chuck type of hot plate according to a first embodiment of the present invention.

FIG. 1 is a schematic illustration of an electrostatic chuck type of hot plate according to a first embodiment of the present invention.

This hot plate is roughly constructed from an alumina substrate 2 as a plate body on which a semiconductor substrate is placed, an electrostatic chuck electrode embedded in the substrate 2 for electrically fixing the semiconductor substrate 1 to the alumina substrate 2, a heating electrode 4 embedded in the alumina substrate 2 below an electrostatic chuck electrode 3, and two temperature measuring probes 5a and 5b provided in the alumina plate for measuring the temperatures of central and peripheral portions of the semiconductor substrate 1. The probes are made of the same material as the heating electrode 4.

On the back of the alumina substrate 2, terminals of the temperature measuring probes 5a and 5b are exposed. Thermocouples 6a and 6b are electrically connected with the exposed terminals of the probes 5a and 5b, respectively. The electrostatic chuck electrode 3 and the heating electrode 4 are connected with power supplies 7 and 8, respectively.

Although alumina is used here as the material of the plate body, another insulating material, such as aluminium nitride or the like, may be used. Materials of the heating electrode 4 and the temperature measuring probes 5a and 5b are conductors that contain at least one of W, Nb, Ti, Ta, and Re. As a typical example, W is used, and when it is desired to increase the quantity of heat generated by the heating electrode 4, a compound of W and Re or C (carbon) higher in resistivity than W is used.

The material of the heating electrode 4 and the temperature measuring probes 5a and 5b is higher in thermal conductivity and electrical conductivity than the material of the plate body. The reason for using a material of high thermal conductivity as the material of the temperature measuring probes in particular is to decrease the quantity of heat emitted from the probes and permit the accurate measurement of substrate temperatures.

From a different point of view, the material of the temperature measuring probes is a conductor and the material of the plate body is an insulator. The reason is that the probes need to be electrically connected to the thermocouples 6a and 6b, and the plate body is required to prevent the probes, heating electrode 4, and the electrostatic chuck electrode 3 from short-circuiting.

The power supply 8 is connected with a temperature controller 9, which operates based on temperature measurements by the thermocouples 6a and 6b to control voltage applied to the heating electrode 4 so that the temperature of the semiconductor substrate 1 is maintained at a predetermined value. The thermocouples 6a and 6b are coupled with the temperature controller 9.

FIGS. 2A through 2H are sectional views, in the order of steps of manufacture, of the electrostatic chuck type of hot plate shown in FIG. 1. The method of manufacture of the hot plate will be described here in terms of a case where the alumina substrate 2 is formed by stacking green sheets $2_1$ to $2_7$ each made of alumina.

Figure 2A:
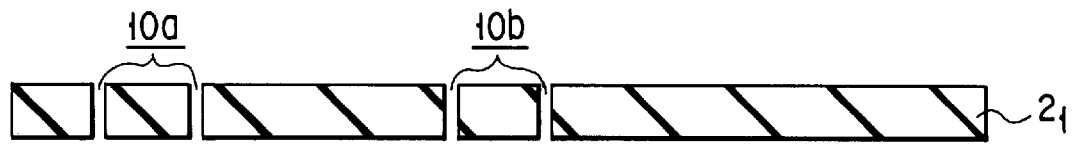
FIGS. 2A through 2H are sectional views, in the order of steps of manufacture, of the electrostatic chuck type of hot plate shown in FIG. 1.

First, as shown in FIG. 2A, two pairs of through holes 10a and 10b for the temperature measuring probes 5a and 5b are formed in a first green sheet $2_1$.

Figure 2B:
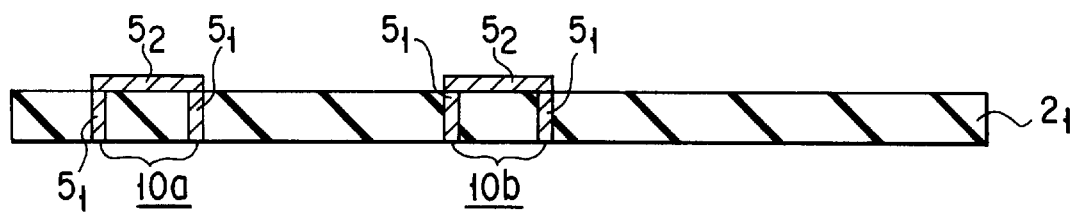

Then, as shown in FIG. 2B, each of the through holes 10a and 10b is filled with a first W film $5_1$. The first W film inside each pair of through holes forms part of a corresponding one of the temperature measuring probes 5a and 5b. After that, a second W film $5_2$ is formed by means of screen printing onto the first green sheet $2_1$ so that it is connected with the first W film $5_1$ inside each pair of through holes. The second W film also forms part of a corresponding one of the temperature measuring probes.

Figure 2C:
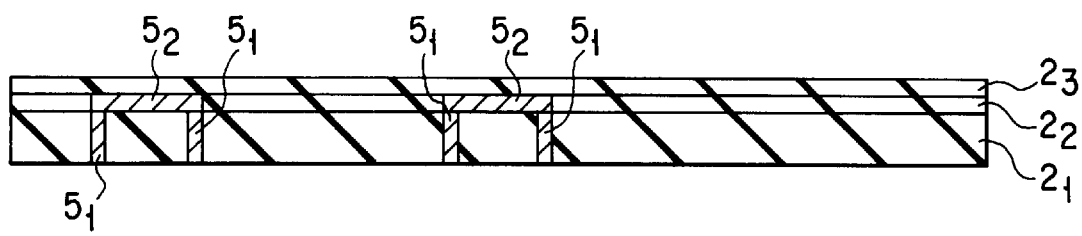

Next, as shown in FIG. 2C, a second green sheet $2_2$ is formed on the first green sheet $2_1$ and then a third green sheet $2_3$ is formed over the entire surface so that the surface of the structure is made planar.

Figure 2D:
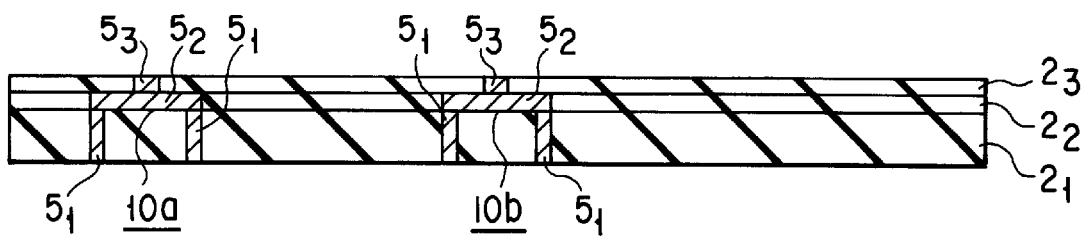

Next, as shown in FIG. 2D, through holes 10a and 10b are formed in the third green sheet $2_3$ to reach the corresponding underlying second W film $5_2$. After that, the through holes 10a and 10b are each filled with a third W film $5_3$ that forms part of a corresponding one of the temperature measuring probes 5a and 5b.

Figure 2E:
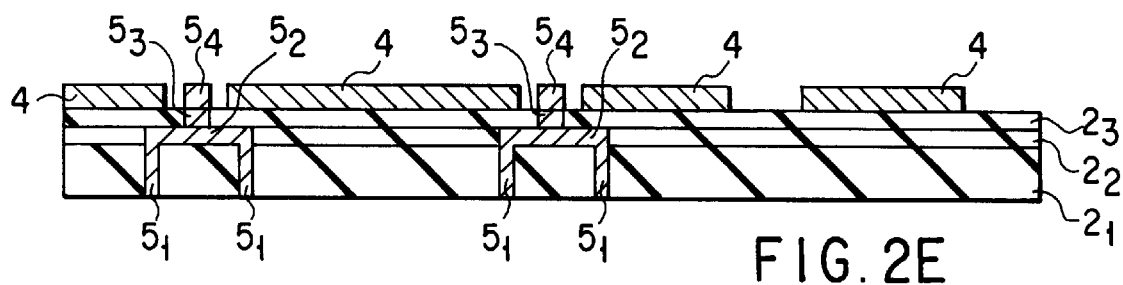

Next, as shown in FIG. 2E, a fourth W film $5_4$ that forms a corresponding one of the probes 5a and 5b and a W film 4 that forms a heating electrode is formed by means of screen printing onto the third green sheet $2_3$.

Figure 2F:
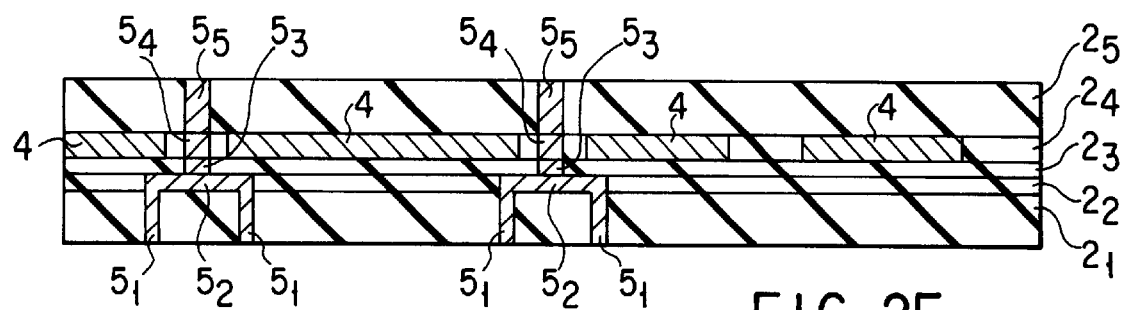

Next, as shown in FIG. 2F, a fourth green sheet $2_4$ is formed on the third green sheet $2_3$ so that the surface of the structure is made planar. A fifth green sheet $2_5$, which has through holes filled with a fifth W film $5_5$ that forms part of a corresponding one of the temperature measuring probes 5a and 5b, is formed over the fourth green sheet $2_4$ so that the corresponding corresponding fourth and fifth films $5_4$ and $5_5$ come into contact with each other.

Figure 2G:
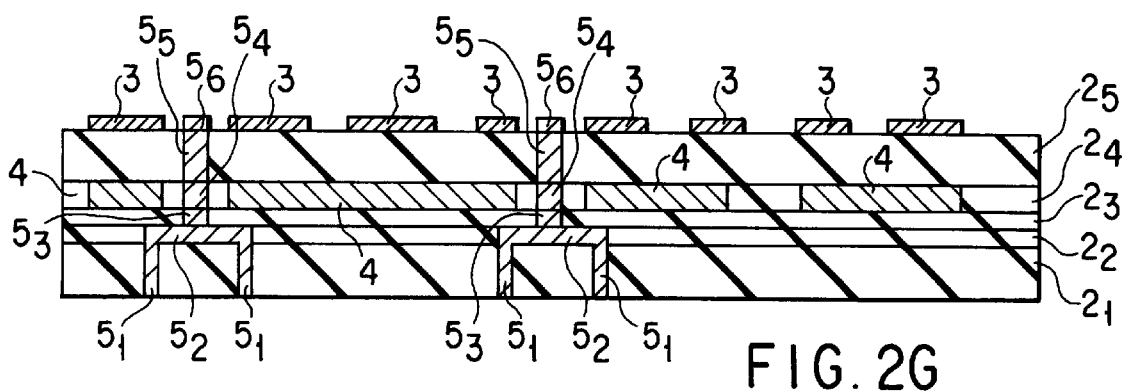

Next, as shown in FIG. 2G, a sixth W film $5_6$ that forms a corresponding one of the probes 5a and 5b and a W film 3 that forms an electrostatic chuck electrode are formed by means of screen printing onto the fifth green sheet $2_5$ and the fifth W film $5_5$.

Figure 2H:
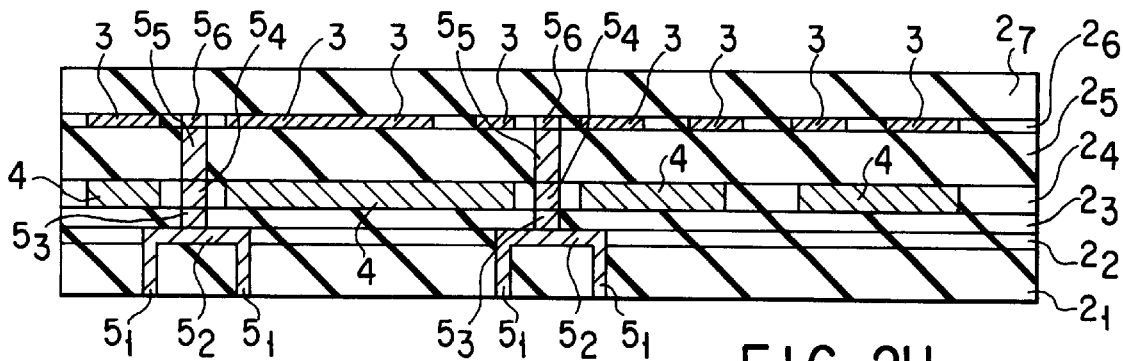

Next, as shown in FIG. 2H, a sixth green sheet $2_6$ is formed on the fifth green sheet $2_5$ so that the surface of the structure is made planar. After that, a seventh green sheet $2_7$ is formed onto the planar surface of the structure. The first through seventh green sheets $2_1$ through $2_7$ are then sintered. Subsequent to this process, the structure is subjected to finishing polishing so that its top is planarized.

The melting point of the electrostatic chuck electrode 3, the heating electrode 4, the temperature measuring probes 5*a* and 5*b* is higher than the sintering temperature of the material of the plate body; thus, there is no problem that the heating electrode and the probes melt and lose their respective functions when the first through seventh alumina green sheets are sintered.

Finally, the electrostatic chuck electrode 3 and the heater electrode 4 are connected with the power supplies 7 and 8, respectively, and the thermocouples 6*a* and 6*b* are connected with the exposed terminals of the probes 5*a* and 5*b*, respectively, whereby the electrostatic chuck type hot plate is finished.

According to the manufacturing method described above, the first through sixth W films that form the temperature measuring probes 5*a* and 5*b* can be formed by means of screen printing with good reproducibility as in the case of the electrostatic chuck electrode 3 and the heating electrode 4. For this reason, the temperature of the hot plate can be measured with good repeatability by measuring the temperatures of the temperature measuring probes 5*a* and 5*b*. In addition, the thermocouples can be connected with the temperature measuring probes with good repeatability, which brings about an improvement in the repeatability of measured temperatures.

Thus, since the temperature of the hot plate can be measured with good repeatability, the feedback control by the temperature controller 9 allows the substrate to be kept at a predetermined temperature with high accuracy.

Moreover, since the terminals of the temperature measuring probes 5*a* and 5*b* are exposed, in the event that a failure occurs in the connection between the probes and the thermocouples, repairs can be made with ease (replacement of the thermocouples). Furthermore, since the terminals of the temperature measuring probes 5*a* and 5*b* are exposed, the thermocouples can be attached to the hot plate with ease and the down time in replacing the hot plate with another can be reduced. For this reason, the utilization of the apparatus will not be lowered considerably.

In addition, since the temperature measuring probes 5*a* and 5*b* are made of films of W as with the electrostatic chuck electrode 3 and the heating electrode 4, the process requires fewer steps as compared with a case where different conducting films are used.

By the way, one example of a method of fixing a semiconductor substrate to a hot plate is to press mechanically the semiconductor substrate against the hot plate through the use of clamps by way of example. However, unlike the electrical method using electrostatic absorption, this mechanical method has a problem that film attaches to the pressing members and the mechanical pressing members causes the semiconductor substrate to abrade. That is, a source of dust is formed.

Second Embodiment

Figure 3:
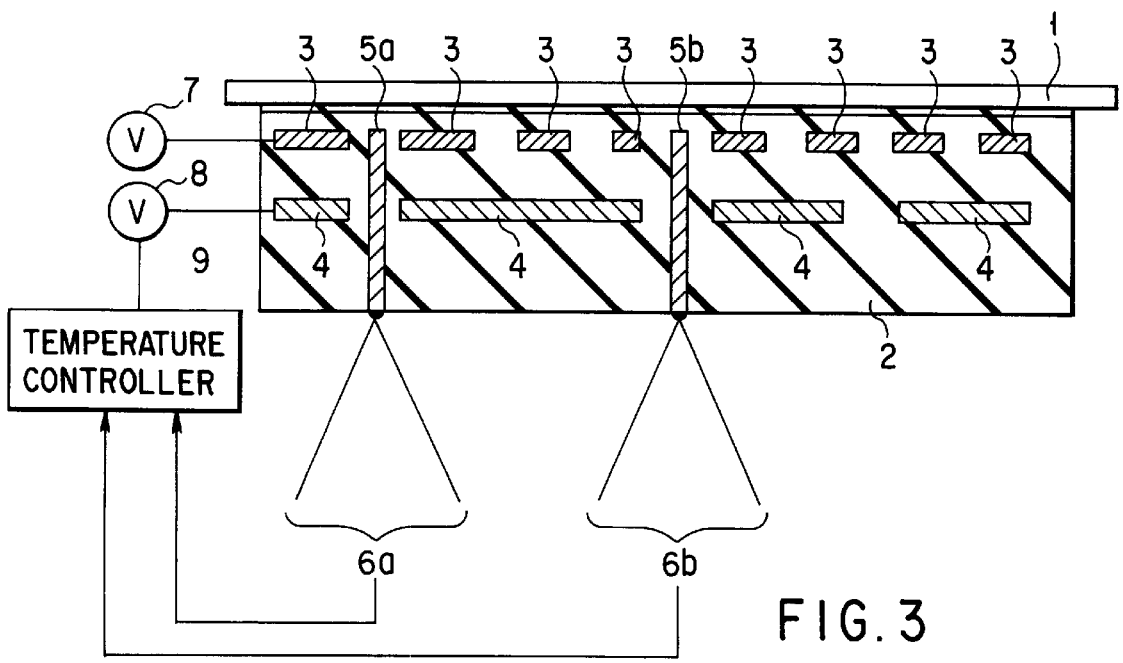
FIG. 3 is a sectional view of an electrostatic chuck type of hot plate according to a second embodiment of the present invention.

In FIG. 3, there is illustrated in sectional view an electrostatic chuck type hot plate according to a second embodiment of the present invention. In this figure, like reference numerals are used to denote corresponding parts to those in FIG. 1 and detailed descriptions thereof are omitted. This is the same with other embodiments subsequent to the second embodiment.

The second embodiment is different from the first embodiment in that the temperature measuring probes 5*a* and 5*b* are each formed in the shape of a line. This simple shape allows the hot plate to be manufactured easily as compared with the first embodiment. Such a change in the shape of the probes involves the connection of each of the thermocouples 6*a* and 6*b* to the only exposed terminal of a corresponding one of the probes 5*a* and 5*b*.

Third Embodiment

Figure 4:
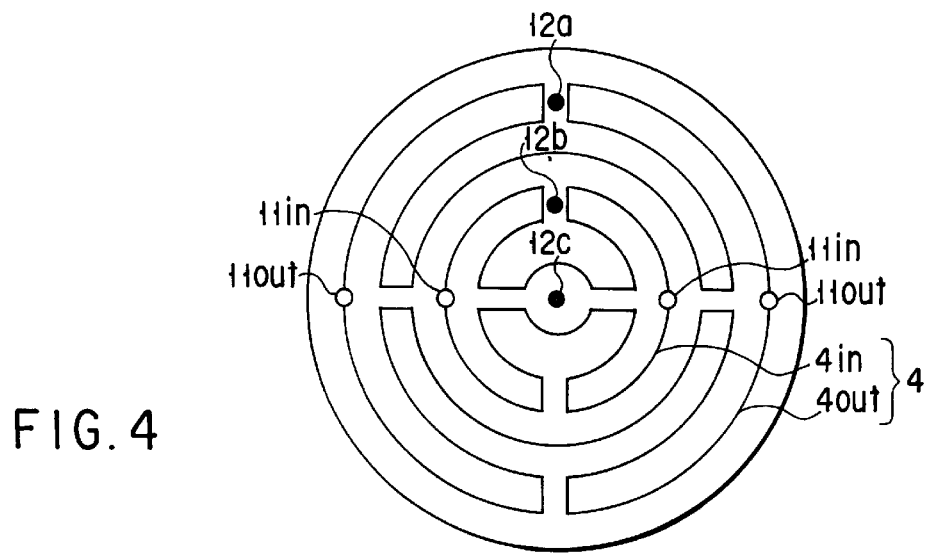
FIG. 4 is a sectional view of an electrostatic chuck type of hot plate according to a third embodiment of the present invention.

FIG. 4 is a plan view of an electrostatic chuck type hot plate according to a third embodiment of the present invention. The heating electrode 4 is shown by lines for simplicity.

The third embodiment is distinct from the first embodiment in that the heating electrode 4 is divided into an inner portion 4in and an outer portion 4out and each portion is individually controlled for applied voltage. The temperature measuring probes increase to three in number and their shape is linear as in the second embodiment. In FIG. 4, 11in and 11out denote inner heater terminals and outer heater terminals, respectively, and 12*a*, 12*b* and 12*c* denote the positions of temperature measurement terminals of the three temperature measuring probes.

With such a configuration, the temperatures at three points along a radial line are measured by the thermocouples and the voltages applied to the inner portion 4in and the outer portion 4out of the heating electrode 4 are independently controlled by the temperature controller, so that the uniformity of temperature in the plane is improved. By further increasing the number into which the heating electrode is divided and the number of the temperature measuring probes, the uniformity of temperature in the plane will be further improved.

Fourth Embodiment

Figure 5:
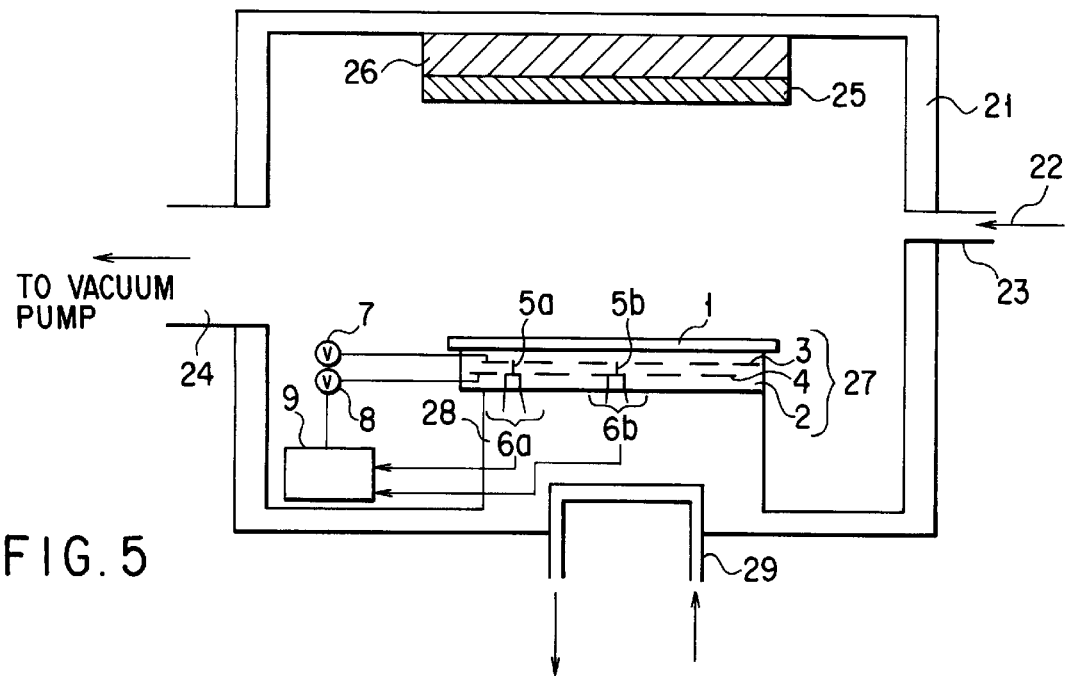
FIG. 5 is a schematic illustration of a sputtering system according to a fourth embodiment of the present invention.

FIG. 5 is a schematic illustration of a sputtering system according to a fourth embodiment of the present invention.

This sputtering system is different from conventional ones in that an electrostatic chuck type hot plate 27 of the present invention is used. Although the electrostatic chuck type of hot plate of the first embodiment is illustrated, a hot plate of another embodiment may be used.

In FIG. 5, 21 denotes a sputtering chamber, which is equipped with a sputtering gas inlet 23 for introducing a sputtering gas, such as Ar, into the sputtering chamber and an exhausting outlet 24 connected to a vacuum pump (not shown) for exhausting the chamber.

A cathode 26 that holds a sputtering target 25 is provided at the top of the sputtering chamber 21. At the bottom of the sputtering chamber, on the other hand, a stage 28 on which the hot plate 27 is to be placed is provided so that it is opposed to the cathode. A water cooling pipe 29 is buried in the stage 28 for cooling the hot plate 27.

The sputtering method using the sputtering system thus arranged will be described next.

First, a semiconductor substrate 1 is carried into the sputtering chamber 21 and then placed on the hot plate 27. Next, a voltage is applied from the power supply 7 to the electrostatic chuck electrode 3, so that the semiconductor substrate 1 is fixed to the hot plate 27. Next, a voltage is applied from the power supply 8 to the heating electrode 4, so that, after 30 seconds, the semiconductor substrate 1 is heated up to 450° C. Next, a DC power is applied to the sputtering target 25 to start film formation. Note that, depending on the process, the heating electrode 4 may be powered after or before the semiconductor substrate 1 is placed on the hot plate.

During film formation, the semiconductor substrate 1 is supplied with energy through plasma, so that the temperature of the semiconductor substrate rises. However, the temperature controller 9 performs feedback control on the power supply 8 for the heating electrode 4 in response to the temperature measurements by the thermocouples 6a and 6b, thereby allowing the temperature of the semiconductor substrate to be maintained at 450° C.

The sputtering system of this embodiment has no limitation on the types of films to be formed, but it is particularly useful to a process that requires accurate temperature control, for example, the formation of Al or Cu films as dual damascene interconnections.

Although the fourth embodiment has been described in terms of a sputtering system, the embodiment is equally applicable to other semiconductor manufacturing apparatuses such as CVD apparatuses, RIE apparatuses, CDE apparatuses, and resist baking apparatuses. In brief, no limitation lies in the types of apparatuses so long as they use an electrostatic chuck type of hot plate.

The present invention is not limited to the above-described embodiments. For example, although the embodiments use the same material for the heating electrodes 4 and the temperature measuring probes 5a and 5b to gain process benefits, different materials may be used for the purpose of gaining only the advantages of a finished hot plate.

The present invention may be practiced or embodied in still other ways without departing from the scope and spirit thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A hot plate comprising:
   a plate body on which a semiconductor substrate is placed;
   a heating electrode embedded within the plate body; and
   at least one temperature measuring probe formed of a material identical to that of the heating electrode and embedded within the plate body near said heating electrode, said heating electrode and said temperature measuring probe being fixed in said plate body.

2. The hot plate according to claim 1, in which a thermocouple is connected with the temperature measuring probe.

3. The hot plate according to claim 1, in which the temperature measuring probe is made of a material that is higher in thermal conductivity than that of the plate body.

4. The hot plate according to claim 1, in which the temperature measuring probe is made of a material that is higher in electrical conductivity than that of the plate body.

5. The hot plate according to claim 1, in which the temperature measuring probe is made of a conducting material and the plate body is made of an insulating material.

6. The hot plate according to claim 1, in which the temperature measuring probe is made of a conducting material that contains at least one of W, Nb, Ti, Ta, and Re and the plate body is made of either an insulating material that contains Al and oxygen or an insulating material that contains Al and N.

7. The hot plate according to claim 1, in which the melting point of the material of the temperature measuring probe and the heating electrode is higher than the sintering temperature of the material of the plate body.

8. The hot plate according to claim 1, in which a voltage applied to the heating electrode is controlled on the basis of the temperature measurement by the temperature measuring probe.

9. The hot plate according to claim 1, in which an electrostatic chuck electrode is formed within the plate body.

10. A method of manufacturing a semiconductor device comprising:
    placing a semiconductor substrate on a hot plate including a plate body on which a semiconductor substrate is to be placed, a heating electrode embedded within the plate body, and a temperature measuring probe formed of a material identical to that of the heating electrode and embedded within the plate body near said heating electrode, said heating electrode and said temperature measuring probe being fixed in said plate body; and
    processing the semiconductor substrate while maintaining the semiconductor substrate at a predetermined temperature by controlling a voltage application unit for applying a voltage to the heating electrode and a cooling unit for cooling the hot plate on the basis of temperature measurements by the temperature measuring probe.

11. The method according to claim 10, in which the step of processing the semiconductor substrate includes forming a film.

12. The method according to claim 10, in which the step of processing the semiconductor substrate includes etching.

13. The method according to claim 10, in which the step of processing the semiconductor substrate includes resist baking.

14. A method of manufacturing the semiconductor device according to claim 10, wherein:
    said temperature measuring probe includes a probe for measuring temperature in a central portion of the semiconductor substrate and a probe for measuring temperature of a peripheral portion of the semiconductor substrate.

15. A hot plate according to claim 1, wherein said temperature measuring probe is integrally formed with plate body.

16. A method according to claim 10, wherein said temperature measuring is integrally formed with the plate body.

17. A hot plate according to claim 1, wherein said semiconductor substrate is directly placed on said plate body.

18. A method of manufacturing a semiconductor device according to claim 10, wherein said semiconductor substrate is directly placed on said plate body.

* * * * *